(12) United States Patent
Grantham

(10) Patent No.: US 8,360,833 B2
(45) Date of Patent: Jan. 29, 2013

(54) METHOD AND APPARATUS FOR ATTACHMENT AND REMOVAL OF FANS WHILE IN OPERATION AND WITHOUT THE NEED FOR TOOLS

(75) Inventor: Roy Grantham, O'Fallon, MO (US)

(73) Assignee: American Power Conversion Corporation, West Kingston, RI (US)

( * ) Notice: Subject to any disclaimer, the term of this patent is extended or adjusted under 35 U.S.C. 154(b) by 763 days.

(21) Appl. No.: 12/474,094

(22) Filed: May 28, 2009

(65) Prior Publication Data

US 2010/0300648 A1    Dec. 2, 2010

(51) Int. Cl.
*H05K 5/00*    (2006.01)

(52) U.S. Cl. ......................................... 454/184; 361/695

(58) Field of Classification Search .................. 454/184, 454/185, 186, 187, 292; 361/701; 135/94, 135/93

See application file for complete search history.

(56) References Cited

U.S. PATENT DOCUMENTS

| | | | |
|---|---|---|---|
| 1,680,092 A | 8/1928 | Dixson | |
| 2,060,582 A | 11/1936 | Leffert | |
| 3,545,224 A | 12/1970 | Nicoski et al. | |
| 3,791,089 A | 2/1974 | Alderman | |
| 4,063,431 A | 12/1977 | Dankowski | |
| 4,083,245 A | 4/1978 | Osborn | |
| 4,138,857 A | 2/1979 | Dankowski | |
| 5,028,087 A | 7/1991 | Ells | |
| 5,259,206 A | 11/1993 | Dankowski | |
| 5,279,360 A | 1/1994 | Hughes et al. | |
| 5,341,870 A | 8/1994 | Hughes et al. | |
| 5,533,259 A | 7/1996 | Hughes et al. | |
| 5,879,232 A | 3/1999 | Luter, II et al. | |
| 5,924,300 A | 7/1999 | Fromm et al. | |
| 6,034,873 A * | 3/2000 | Ståhl et al. | ..................... 361/701 |
| 6,199,337 B1 | 3/2001 | Colson et al. | |
| 6,315,525 B1 * | 11/2001 | Webb | ............................ 417/313 |

(Continued)

FOREIGN PATENT DOCUMENTS

DE          20014274 U1    11/2000
DE    20 2004 003309 U1     8/2004

(Continued)

OTHER PUBLICATIONS

International Search Report for PCT/US2009/053759 mailed Apr. 9, 2010.

(Continued)

*Primary Examiner* — Steven B McAllister
*Assistant Examiner* — Jamil Decker
(74) *Attorney, Agent, or Firm* — Lando & Anastasi, LLP

(57) ABSTRACT

Disclosed is an air containment cooling system for containing air between two rows of equipment racks. The air containment cooling system comprises a canopy assembly configured to enclose a hot aisle defined by two rows of equipment racks and a cooling system embedded within the canopy assembly, the cooling system being configured to cool air disposed within the hot aisle, the cooling system including a heat exchanger, a mounting plate coupled to the canopy assembly, and a fan assembly configured to move air to the heat exchanger, the fan assembly being releasably mounted on the mounting plate. The fan assembly may include a fan unit having a fan and a motor and a mounting ring configured to mount the fan unit thereon. The mounting ring may have at least one mounting post configured to pass through a key slot formed in the mounting plate.

16 Claims, 15 Drawing Sheets

U.S. PATENT DOCUMENTS

| | | | |
|---|---|---|---|
| 6,343,011 B1 | 1/2002 | Yu | |
| 6,668,565 B1 | 12/2003 | Johnson et al. | |
| 6,672,955 B2 * | 1/2004 | Charron | 454/184 |
| 6,732,789 B2 | 5/2004 | Jang | |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |
| 7,046,514 B2 | 5/2006 | Fink et al. | |
| 7,140,193 B2 | 11/2006 | Johnson et al. | |
| 7,145,772 B2 | 12/2006 | Fink | |
| 7,165,412 B1 | 1/2007 | Bean, Jr. | |
| 7,173,820 B2 | 2/2007 | Fink et al. | |
| 7,259,963 B2 | 8/2007 | Germagian et al. | |
| 7,278,273 B1 | 10/2007 | Whitted et al. | |
| 7,293,666 B2 | 11/2007 | Mattlin et al. | |
| 7,297,022 B2 * | 11/2007 | Pearce | 439/537 |
| 7,325,410 B1 | 2/2008 | Bean, Jr. | |
| 7,372,695 B2 | 5/2008 | Coglitore et al. | |
| 7,403,391 B2 | 7/2008 | Germagian et al. | |
| 7,430,118 B1 * | 9/2008 | Noteboom et al. | 361/695 |
| 7,508,663 B2 | 3/2009 | Coglitore | |
| 7,508,666 B1 | 3/2009 | Henneberg et al. | |
| 7,511,960 B2 | 3/2009 | Hillis et al. | |
| 7,551,971 B2 | 6/2009 | Hillis | |
| 7,611,327 B2 * | 11/2009 | Holston et al. | 415/213.1 |
| 7,643,285 B2 | 1/2010 | Nishiyama et al. | |
| 7,646,590 B1 | 1/2010 | Corhodzic et al. | |
| 7,724,518 B1 | 5/2010 | Carlson et al. | |
| 7,800,900 B1 | 9/2010 | Noteboom et al. | |
| 7,856,838 B2 | 12/2010 | Hillis et al. | |
| 7,944,692 B2 * | 5/2011 | Grantham et al. | 361/688 |
| 7,957,142 B2 | 6/2011 | Noteboom et al. | |
| 7,990,710 B2 * | 8/2011 | Hellriegel et al. | 361/699 |
| 8,031,468 B2 | 10/2011 | Bean, Jr. et al. | |
| 8,184,435 B2 | 5/2012 | Bean, Jr. et al. | |
| 2003/0050003 A1 * | 3/2003 | Charron | 454/184 |
| 2004/0184232 A1 | 9/2004 | Fink | |
| 2005/0011637 A1 | 1/2005 | Takano | |
| 2005/0209740 A1 | 9/2005 | Vann | |
| 2005/0280986 A1 | 12/2005 | Coglitore et al. | |
| 2006/0260338 A1 | 11/2006 | VanGilder et al. | |
| 2006/0283111 A1 | 12/2006 | Ayers et al. | |
| 2007/0084589 A1 | 4/2007 | Nishino et al. | |
| 2007/0146994 A1 | 6/2007 | Germagian et al. | |
| 2007/0167125 A1 | 7/2007 | Rasmussen et al. | |
| 2007/0262606 A1 | 11/2007 | Schnoblen et al. | |
| 2008/0043426 A1 | 2/2008 | Nishiyama et al. | |
| 2008/0055850 A1 * | 3/2008 | Carlson et al. | 361/695 |
| 2008/0060372 A1 | 3/2008 | Hillis et al. | |
| 2008/0141525 A1 | 6/2008 | Breiding et al. | |
| 2008/0185446 A1 | 8/2008 | Tozer | |
| 2008/0291626 A1 * | 11/2008 | Nelson et al. | 361/696 |
| 2009/0014397 A1 | 1/2009 | Moss et al. | |
| 2009/0025418 A1 | 1/2009 | De La Cruz et al. | |
| 2009/0046427 A1 | 2/2009 | Noteboom et al. | |
| 2009/0086428 A1 | 4/2009 | Campbell et al. | |
| 2009/0241578 A1 | 10/2009 | Carlson et al. | |
| 2009/0251860 A1 * | 10/2009 | Belady et al. | 361/690 |
| 2009/0255653 A1 | 10/2009 | Mills et al. | |
| 2009/0319650 A1 | 12/2009 | Collins et al. | |
| 2010/0061057 A1 | 3/2010 | Dersch et al. | |
| 2010/0111698 A1 * | 5/2010 | Wiedeman et al. | 416/189 |
| 2010/0144265 A1 * | 6/2010 | Bednarcik et al. | 454/184 |
| 2010/0188816 A1 | 7/2010 | Bean, Jr. et al. | |
| 2010/0190430 A1 * | 7/2010 | Rodriguez et al. | 454/184 |
| 2010/0230058 A1 | 9/2010 | Mahoney | |
| 2010/0263830 A1 * | 10/2010 | Noteboom et al. | 165/80.2 |
| 2010/0307716 A1 * | 12/2010 | Bean et al. | 165/80.2 |
| 2010/0315775 A1 | 12/2010 | Grantham et al. | |
| 2010/0329885 A1 * | 12/2010 | Criner et al. | 416/244 R |
| 2011/0108207 A1 | 5/2011 | Mainers et al. | |
| 2011/0299242 A1 | 12/2011 | Grantham et al. | |
| 2012/0012283 A1 | 1/2012 | Bean, Jr. et al. | |

FOREIGN PATENT DOCUMENTS

| | | |
|---|---|---|
| DE | 202008010718 U1 | 2/2009 |
| EP | 0 033 182 A2 | 8/1981 |
| EP | 1 069 381 A1 | 1/2001 |
| FR | 2949641 A1 | 3/2011 |
| JP | 2003-166729 A | 6/2003 |
| JP | 2005260148 A | 9/2005 |
| JP | 2007316989 A | 12/2007 |
| JP | 2009097774 A | 5/2009 |
| JP | 2010122747 A | 6/2010 |
| SE | 456449 B | 10/1988 |
| WO | 9963797 A1 | 12/1999 |
| WO | 2007090804 A2 | 8/2007 |

OTHER PUBLICATIONS

Invitation to Pay Additional Fees and Partial International Search Report for PCT/US2010/035212 mailed Oct. 5, 2010.

International Search Report for PCT/US2010/035418 mailed Aug. 17, 2010.

International Search Report for PCT/US2009/068506 mailed Apr. 8, 2010.

APC's InfraStruXure(R) Hot-Aisle Containment Systems a Key to Sun's New Energy Efficient Data Center, Press release of American Power Conversion Corporation, West Kingston, R.I., Oct. 16, 2007.

International Search Report for PCT/US2010/035092 dated Aug. 31, 2010.

International Search Report for PCT/US2009/068506 dated Apr. 8, 2010.

"Inter-Rack Flow Seperator to Prevent Computer Rack Hot Exhaust Air Entry into Cold Region at Rack Inlet of Computer Data Center Facilities" IP.COM Journal, IP.COM Inc., West Henrietta, NY, US, Jun. 20, 2006, XP013114636 ISSN: 1533-0001.

International Search Report for PCT/US2010/035212 mailed Feb. 8, 2011.

American Power Conversion Corporation Brochure, "Hot Aisle Containment System (HACS)," 2008, pp. 1-68.

Invitation to Pay Additional Fees and Partial International Search Report for PCT/US2009/053759 mailed Nov. 16, 2009.

Rotheroe et al., "Hot Aisle Based Heat Removal Unit", RD545030, Hewlett-Packard Co., Sep. 2009.

Stahl et al., "Designing an Alternative to Conventional Room Cooling", Interlec 2001, Oct. 2001, pp. 109-115.

* cited by examiner

METHOD AND APPARATUS FOR ATTACHMENT AND REMOVAL OF FANS WHILE IN OPERATION AND WITHOUT THE NEED FOR TOOLS

BACKGROUND OF THE DISCLOSURE

1. Field of Invention

The present disclosure relates to air containment cooling systems, and more particularly to apparatus and methods for toollessly attaching fan assemblies to cooling enclosures of the type used in conjunction with data processing, networking, and telecommunications equipment.

2. Discussion of Related Art

Current methods/apparatus used for mounting equipment, such as fan assemblies, onto surfaces, such as overhead mounting assemblies, and/or cooling enclosures for racks for electronic equipment use screws or other fasteners for attaching the equipment to a mounting plate. Such a cooling enclosure including fan assemblies is disclosed in pending U.S. patent application Ser. No. 12/361,087 entitled HOT AISLE CONTAINMENT COOLING SYSTEM AND METHOD, filed Jan. 28, 2009, which is owned by the assignee of the present disclosure and incorporated herein in its entirety for all purposes.

For example, conventional fan modules require the use of screw drivers or other tools to install or remove the fan modules from mounting plates. Traditional fastening techniques requiring tools add to the component count and cost of conventional fan modules.

An example of a fan module 100 is illustrated in FIGS. 1 and 2. The fan module 100 includes a mounting body 102. In use, this mounting body may be secured in or onto a structure to which the fan is to be mounted. Also included in the conventional fan module 100 is a fan assembly 104 and a fan cover screen 106. The fan assembly 104 may include a fan and a motor for driving the fan. The fan assembly 104 may be secured to the mounting body 102 by one or more connectors 108 which may be screws, bolts, or similar connectors. The fan cover screen 106 may be secured to the fan assembly 104 by connectors 110, which may also be screws, bolts or similar connectors. An electrical connector 112 may be included in the fan module 100 for providing an electrical connection from a power supply cable (not shown) to the fan assembly 104. A circuit board 114 which may contain one or more fuses, capacitors, or other electrical components may be provided in electrical communication with the electrical connection 112.

Other typical fan mounting methods include the use of screws, threaded studs, or similar fasteners which require tools for installation or removal.

SUMMARY OF THE DISCLOSURE

One aspect of the disclosure is directed to an air containment cooling system for containing air between two rows of equipment racks. The air containment cooling system may comprise a canopy assembly configured to enclose a hot aisle defined by two rows of equipment racks, a cooling system embedded within the canopy assembly, the cooling system being configured to cool air disposed within the hot aisle, the cooling system including a heat exchanger, a mounting plate coupled to the canopy assembly, and a fan assembly configured to move air to the heat exchanger, the fan assembly being releasably mounted on the mounting plate, the fan assembly including a fan unit having a fan and a motor and a mounting ring configured to mount the fan unit thereon, the mounting ring having a first interconnect configured to be secured to a second interconnect provided in the mounting plate to secure the mounting ring to the mounting plate.

According to an embodiment of the air containment cooling system, the first interconnect comprises a mounting post. The second interconnect may comprise a slot formed in the mounting plate. The first interconnect may comprise a flexible locking flange. The second interconnect may comprise a recess formed in the mounting plate. The fan assembly may further includes an alignment post configured to pass through a recess formed in the mounting plate and to align a floating mating connector coupled to the mounting plate with an electrical connector on the fan assembly. The fan assembly may further include a wiring assembly, and an alignment post configured to align the mounting ring in a predetermined position with respect to the mounting plate.

Another aspect of the disclosure is directed to a method of mounting a fan assembly to a canopy of a cooling system. The method may comprise securing a mounting plate to the canopy, the mounting plate including a first interconnect formed therein, providing a fan assembly including a fan unit having a fan and a motor, and a mounting ring configured to mount the fan unit thereon, the mounting ring having a second interconnect, securing the fan assembly to the mounting plate by securing the first interconnect to the second interconnect, and electrically connecting an electrical connector on the fan module to a power supply.

According to an embodiment of the method of mounting a fan assembly to a canopy of a cooling system, the first interconnect comprises a slot. The second interconnect may comprise a mounting post. Securing the first interconnect to the second interconnect may comprise inserting the mounting post into the slot and displacing the mounting post within the slot. The mounting post may be configured with an undercut. The mounting ring may further comprise a flexible locking flange, and the method may further comprise inserting the flexible locking flange into a recess in the mounting plate. The method may further comprise removing the fan assembly from the mounting plate and may comprise moving a first side of the flexible locking flange toward a second side of the flexible locking flange to a sufficient degree such that the flexible locking flange may be removed from the recess in the mounting plate, displacing the mounting post within the slot, and removing the mounting post from within the slot. The method may comprise removing the fan assembly from the mounting plate without tools and by accessing only a single side of the mounting plate. Displacing the mounting post within the slot may comprise rotationally displacing the mounting ring. Displacing the mounting post within the slot may comprise linearly displacing the mounting post.

Another aspect of the disclosure is directed to an air containment cooling system for containing air between two rows of equipment racks. The air containment cooling system may comprise a means for enclosing a hot aisle defined by two rows of equipment racks, a cooling system embedded within the means for enclosing the hot aisle, the cooling system being configured to cool air disposed within the hot aisle, the cooling system including a heat exchanger, a first mounting means coupled to the means for enclosing the hot aisle, and a means for moving air to the heat exchanger, the means for moving air to the heat exchanger being releasably mounted on the first mounting means, the means for moving air to the heat exchanger including a second mounting means, the second mounting means having a first interconnect configured to be secured with a second interconnect provided in the first mounting means to secure the second mounting means to the first mounting means.

According to an embodiment of the air containment cooling system, the first mounting means may further include a recess formed therein, and the second mounting means may further include a locking means configured to engage the recess in the first mounting means. The first mounting means may further include a means for aligning an electrical connector.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
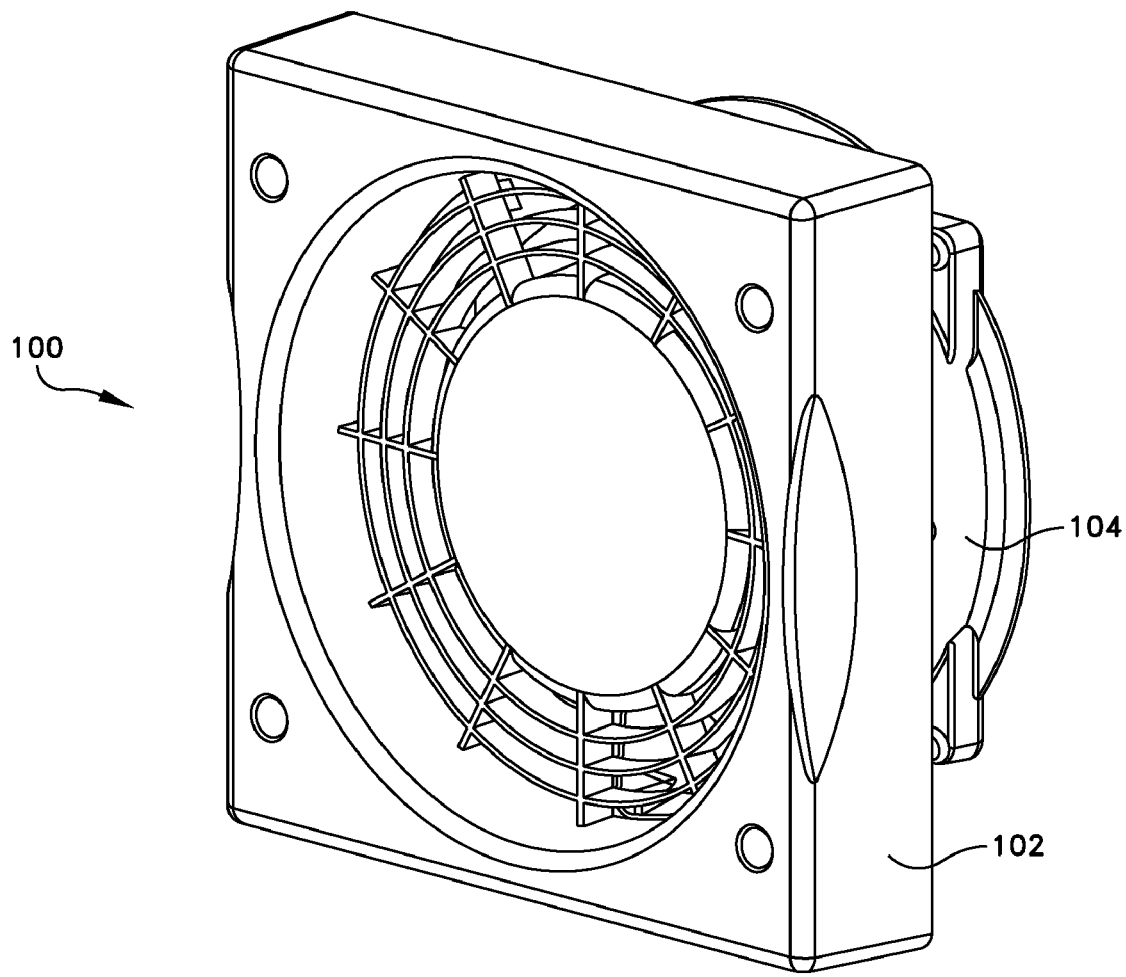
FIG. 1 is a perspective view of a prior art fan assembly.
Figure 2:
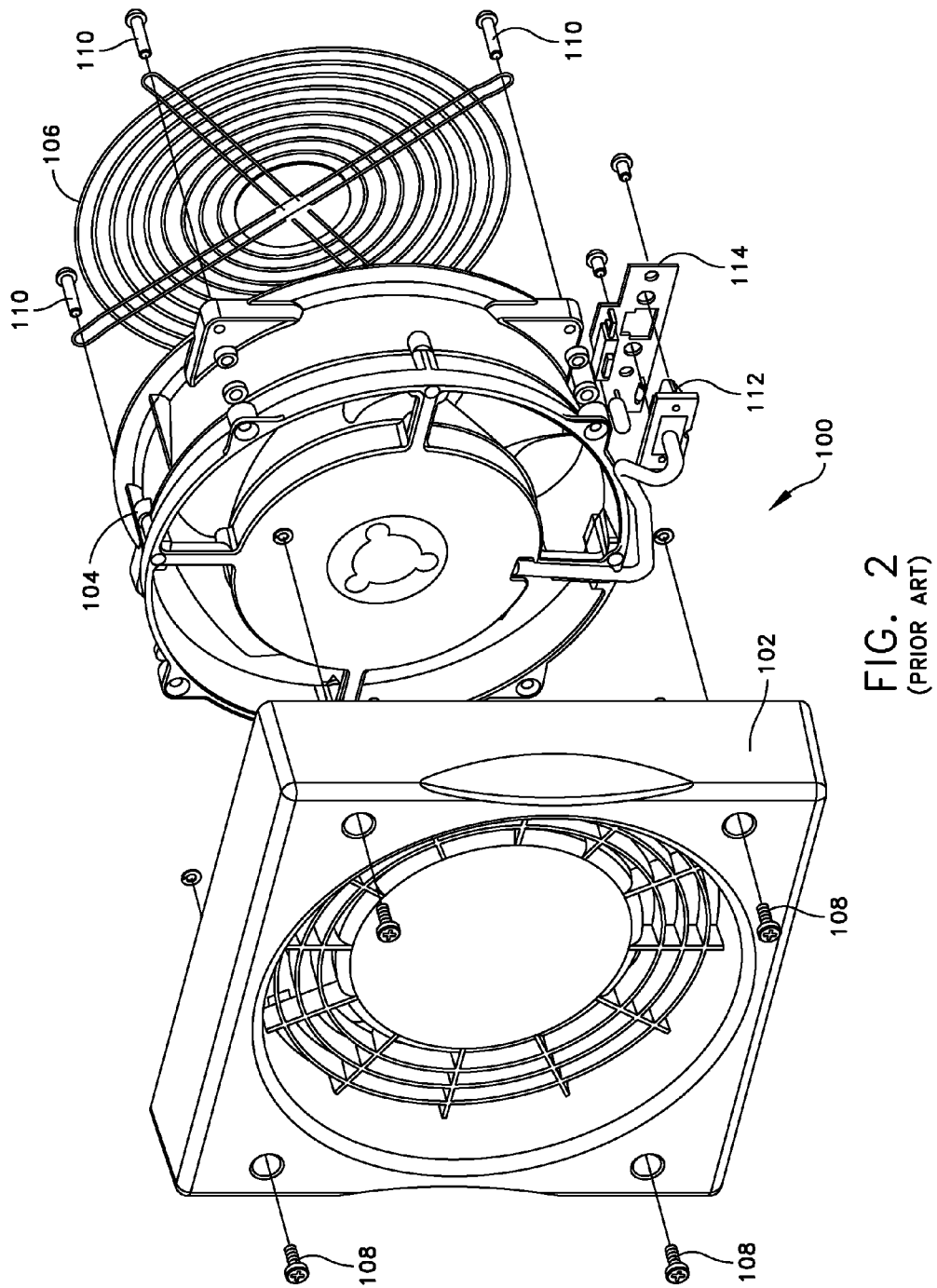
FIG. 2 is an exploded perspective view of the prior art fan assembly shown in FIG. 1.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of methods and apparatus of the present disclosure are directed to apparatus and structures that include fan assemblies. Although the disclosed embodiments are directed toward structures including fan assemblies, the disclosure is not intended to be limited to such. Examples of other items that could be mounted according to methods disclosed herein include transformers, power supplies, light assemblies, control or user-interface panels, and heater assemblies.

Figure 3:
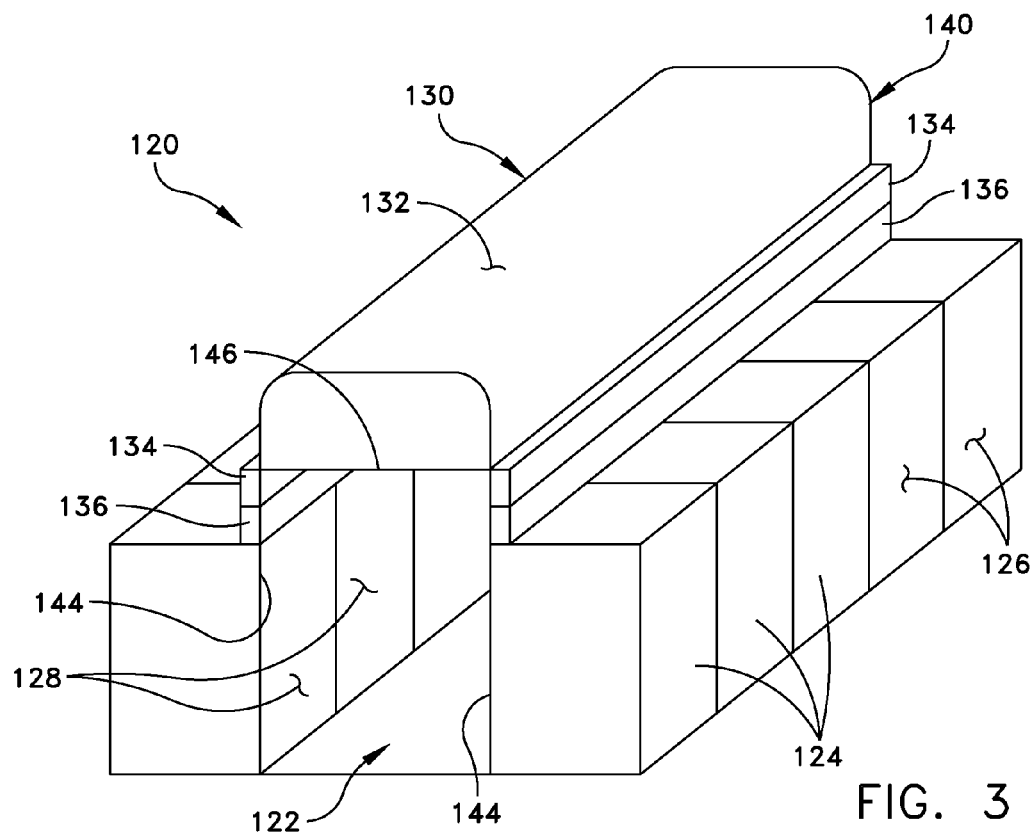
FIG. 3 is a schematic perspective view of a portion of a data center showing a hot aisle defined by two rows of equipment racks and an air containment cooling system of an embodiment of the disclosure for containing and cooling air within the hot aisle.
Figure 4:
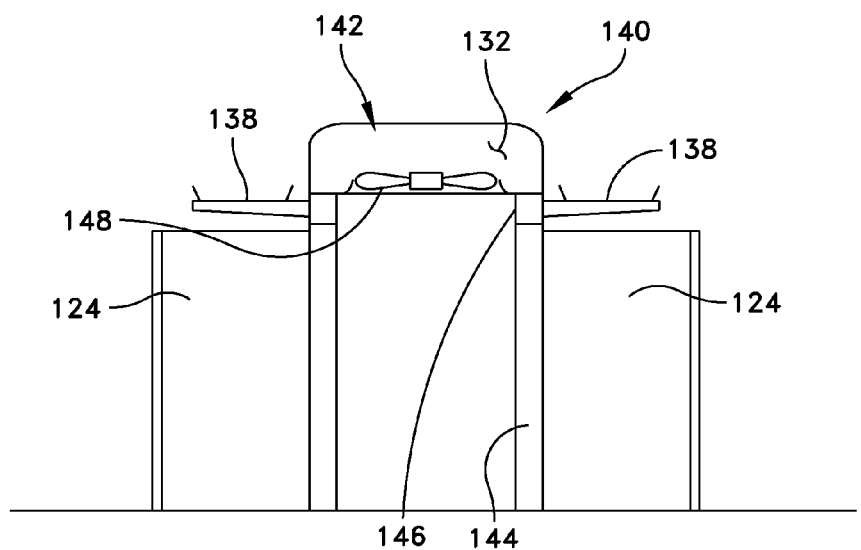
FIG. 4 is a schematic end view of the portion of the data center shown in FIG. 3.
Figure 5:
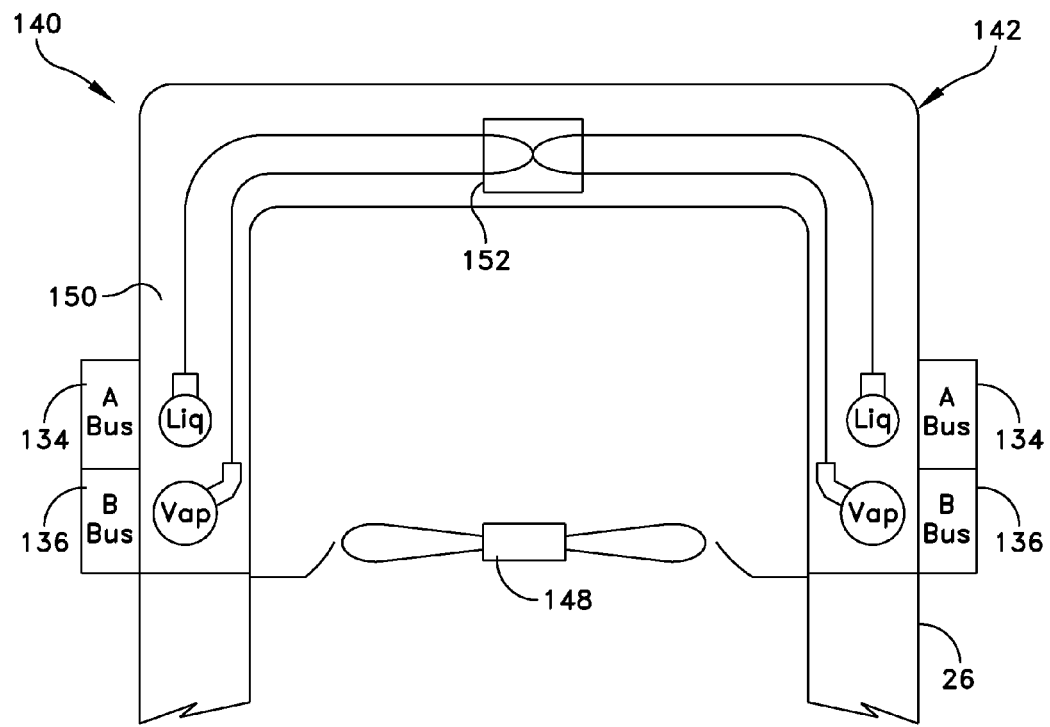
FIG. 5 is a schematic cross-sectional view of air containment cooling system shown in FIGS. 3 and 4.

Fan modules may be installed in an overhead position, such as to a roof of a cooling assembly canopy. An example of a cooling assembly canopy is disclosed in pending U.S. patent application Ser. No. 12/361,087. A portion of a data center 120 including a cooling assembly canopy 130 is illustrated in FIGS. 3-5. In particular, a hot aisle 122 within the data center 120 is illustrated. As shown, and by way of example only, a plurality of equipment racks, each indicated at 124, are disposed within the data center 120 to define the hot aisle 122. Specifically, a first row of equipment racks 124 are positioned so that fronts 126 of the equipment racks face outwardly. Similarly, a second row of equipment racks 124 are positioned so that the fronts of the equipment racks face outwardly and backs 128 of the equipment racks face backs 128 of the first row of equipment racks. The arrangement is such that cool air is drawn through the fronts of the equipment racks to cool the electronic equipment housed within the equipment racks. Hot air is exhausted through the backs of the equipment racks into the hot aisle 122. The aisle 122 may sometimes be referred to herein as the "hot" or "warm" aisle. Further, although not shown, cooling racks may be interposed among the equipment racks 124 for drawing warm air from the hot aisle 122. However, for illustration purposes only, equipment racks 124 are shown in FIGS. 3 and 4. The equipment racks may be placed or docked after the installation of the air containment cooling system.

Warm air is directed from the equipment racks towards the hot aisle 122. The warm air rises, thus creating a situation in which the ceiling of the data center 120 may become too warm. This situation may negatively affect the climate control and management within the data center 120. An air containment cooling system, generally indicated at 140, of embodiments of the present disclosure is designed to contain and control the flow of warm air within the data center 120 in general, while providing power distribution and cable management to the equipment racks docked within the air containment cooling system.

In the embodiment shown in FIG. 3, and with additional reference to FIGS. 4 and 5, the air containment cooling system 140 includes a canopy assembly generally indicated at 142, which is configured to enclose the hot aisle, and a cooling system, which is embedded within the canopy assembly. The canopy assembly 142 includes a frame structure having a plurality of vertical support members, each indicated at 144, and a plurality of horizontal support members, each indicated at 146. The number of vertical and horizontal support members 144, 146 depends on the length of the hot aisle 122. The frame structure is configured to define the docking stations that receive the equipment racks 124.

The canopy assembly 130 further includes a cooling panel 132 that encloses the top of the system and thus contains warm air within the hot aisle 122 defined by the equipment racks 124. The cooling system is disposed within the cooling panel 132, and includes a heat exchanger 150 (shown in FIG. 5) to cool air contained within the canopy assembly 130. In one embodiment, the cooling panel 132 is supported by the heat exchanger 150 of the cooling system. In another embodiment, the frame structure may be configured to support the cooling panel 132 and the heat exchanger 150.

In embodiments of the disclosure, the vertical and horizontal support members 144, 146 support pipes that are configured to deliver coolant from a source (e.g., a chiller) to the heat exchanger 150 and back to the source. The pipes may be provided so that one pipe delivers liquid coolant to the heat exchanger and another pipe exhausts vaporized coolant from the heat exchanger 150. Also, the frame structure may be configured at 152 to provide a center support and crossover. The cooling system further includes a fan 148 supported by the frame structure to direct warm air contained within the hot aisle 122 to the canopy assembly 130 and the heat exchanger 150. Depending on the length of the system 140, more than one fan 148 may be provided.

Still referring to FIGS. 3-5, the air containment cooling system 140 further includes one or more busses that extend along the horizontal support members 146 along the length of the hot aisle 122. As shown, in one embodiment, each side of the canopy assembly 142 includes two busses—an A Bus 134 and a B Bus 136. Each bus 134, 136 provides power distribution to the enclosures 124, and the provision of two busses provides redundancy to the system. In certain embodiments, the busses 134, 136 may be separated from one another so that each bus is dedicated to performing a certain function. For example, a power distribution bus, a cable management bus and a cooling bus may be provided. As shown in FIG. 3, the busses 134, 136 may be configured to define a side of the canopy assembly 130. In other embodiments, only one bus may be provided on each side of the canopy assembly 130. In a particular embodiment, the electrical bus(es) may have provisions for modular installation of branch circuit protective devices to feed individual electrical circuits into the various equipment racks from a common AC bus.

With reference to FIG. 4, the air containment cooling system 140 may further include one or two cable troughs, each indicated at 138, mounted on one of the busses or to the frame structure of the canopy assembly 130. The cable troughs 138, in addition to the vertical and horizontal support members 144, 146, house and organize cables used to connect the equipment racks 124 to power and networking equipment. The cable troughs 138 may be of the type disclosed in U.S. Pat. No. 6,967,283.

Traditional mounting methods and mechanisms may present safety issues when installing, removing, or servicing fan modules such as fan 148. As fasteners holding the fan module in place are loosened, the fan module may break away or otherwise be released from an overhead mounting position and fall, possibly injuring a technician servicing the fan or causing damage to the fan module. Once the last fastener holding a fan module in place is free, the entire fan module may fall unless somehow supported. It is often inconvenient and/or difficult for a technician to both manipulate tools to install or remove a fan module and at the same time keep the fan module from falling. Some embodiments of the current disclosure provide for an easier and more efficient manner of installation and removal of fan modules, without requiring tools. Some embodiments of the present disclosure for removing a fan module may be performed while the fan module is in operation.

In accordance with certain embodiments of a fan module disclosed herein, no separate fasteners or tools are required to install or remove the fan module. In accordance with certain embodiments, when installed, the fan module hangs from one or more interconnects, which may comprise mounting posts, and is locked into position by one or more additional interconnects, which may comprise locking flanges. Both the mounting posts and the locking flanges are incorporated into a mounting ring or housing coupled to a fan assembly. In alternate embodiments, the mounting posts and the locking flanges are incorporated into a mounting plate or mounting surface and are configured to interface with interconnects which may comprise slots and/or recesses formed on a fan module to hold the fan module in place with respect to the mounting plate or surface. Electrical connection of the fan module to a source of power is made through two mating connectors, one coupled to the fan module and one connector coupled to a fan mounting plate or surface. In some embodiments the electrical connector coupled to a fan mounting plate or surface is "floating" in the sense that it is mounted in a movable position on the fan mounting plate or surface. In alternate embodiments, the floating electrical connector could be located on a fan module rather than a fan mounting plate or surface and an alignment post (discussed below) could be incorporated into a fan module mounting plate or mounting surface.

In accordance with some embodiments, tapered mounting posts, undercut or slotted to produce an engaging surface therein, are provided on a fan module mounting ring or housing for securing the fan module onto a mounting structure. In some embodiments, there is also provided a "V" shaped locking flange which locks the fan module in place onto a mounting structure, but which is flexible enough to be deformed to unlock the fan module from the mounting structure. A sloping alignment post for aligning a floating mating connector (attached to a mounting structure or plate) with an electrical connector electrically coupled to the fan assembly wiring is also provided in some embodiments of fan modules disclosed herein.

In accordance with some embodiments, the mounting posts and/or the locking flange may be formed as parts of an injection molded plastic part which may form part or all of a mounting ring or fan housing for a fan module. The molded part may be attached to the fan module with appropriate fasteners such as screws or bolts. The mounting ring or fan housing could be made of multiple parts and from different materials, instead of a single injection molded part. The fan assembly may also include a printed circuit board including one or more fuses or other electrical components, and a harness connector.

Mating slots and/or holes may be provided within a mounting plate, which is secured to a cooling unit onto which the fan module may be installed. Alternatively, the holes and/or slots may be provided directly in a surface or wall to which a fan module may be mounted. Connection of the fan module to the mounting plate or surface may be accomplished though utilization of the one or more mounting posts, and/or one or more locking flanges, and/or one or more mating harness connections.

Fan modules according to embodiments of the present disclosure may be mounted to a mounting plate by insertion of mounting posts located on the fan module into key slots or bayonet mounts located on the mounting plate. In other embodiments, mounting posts on a mounting plate may be inserted into key slots or bayonet mounts located on a fan module to affix the fan module to the mounting plate. As the fan module is being installed into a cooling unit, an alignment post may contact an edge of an electrical mating connector in the cooling unit, sliding it into a proper mating position. In some embodiments, the mounting posts are concentrically located about a mounting ring or fan housing, which is mechanically coupled to the fan assembly. The fan module may be secured in place in a cooling unit by being rotated into a locked position after insertion of the one or more mounting posts into key slots or bayonet mounts in a mounting plate. Once rotated into the locked position, a locking flange locks the fan module in position by fitting into place within a recess in the mounting plate. The locking flange may be elastically deformed and removed from its recess in order to permit the fan assembly to be rotated back to an unlocked position.

In some embodiments, the mounting posts may be arranged in a linear pattern such that instead of utilizing a rotational movement to lock/unlock the fan module in place, the fan module may be slid vertically or horizontally into a locked, in place position. The number of mounting posts and/or locking flanges and/or sloped connector mate alignment posts could be varied according to the size of the fan module or the amount of locking security desired.

Figure 6:
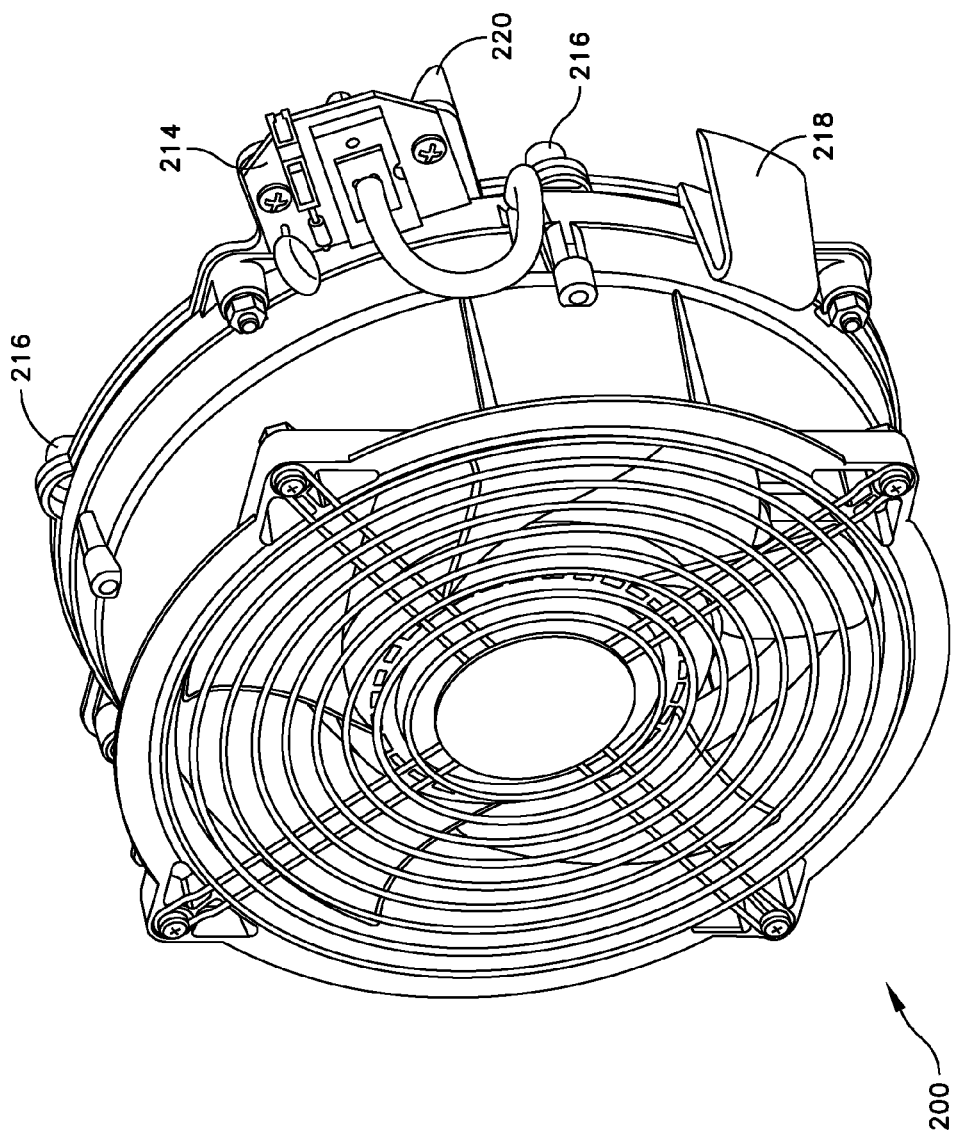
FIG. 6 is a front perspective view of an assembled fan assembly according to embodiments of the present disclosure.
Figure 7:
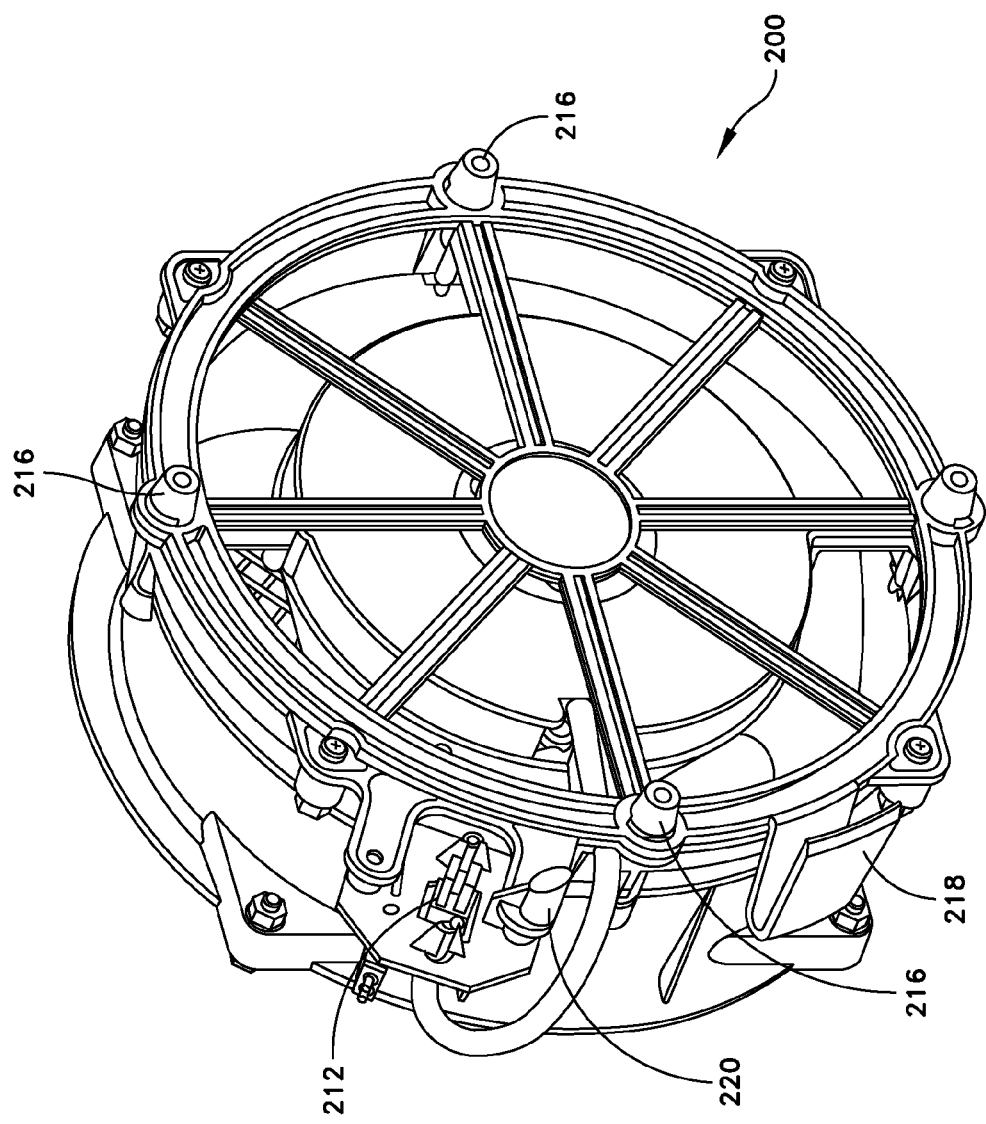
FIG. 7 is a rear perspective view of assembled fan assembly shown in FIG. 6.
Figure 8:
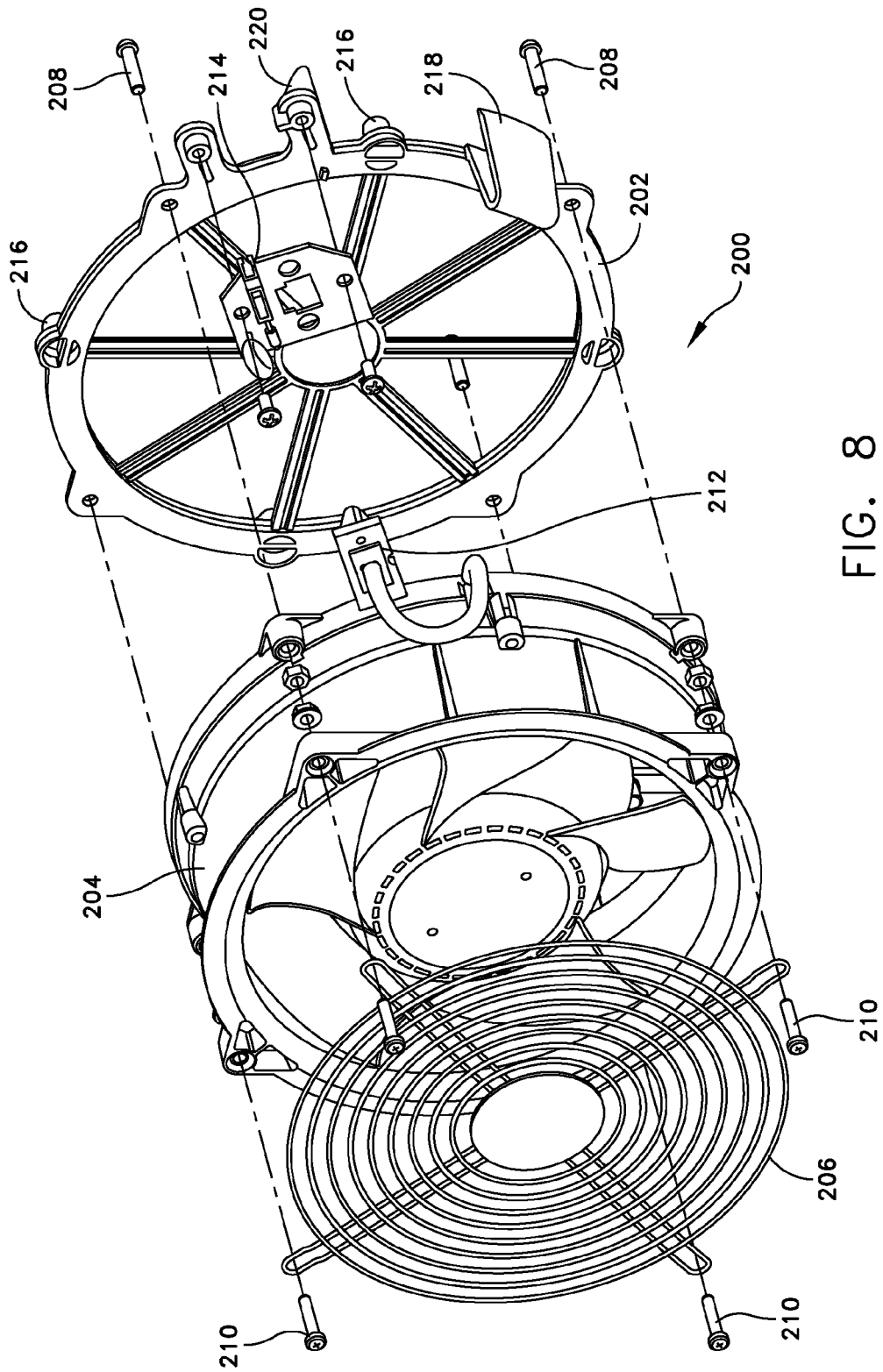
FIG. 8 is an exploded perspective view of the fan assembly shown in FIG. 6.

An embodiment of a fan module 200 according to the present disclosure is illustrated in FIGS. 6-8. The fan module 200 includes a mounting ring 202, a fan assembly 204, and a fan cover screen 206. The fan assembly 204 includes a fan and a motor for driving the rotational movement of the fan. The mounting ring 202 may be secured to the fan assembly 204 by connectors 208, which may embody screws, bolts, or similar types of connectors. The fan cover screen 206 may be secured to the fan assembly 204 by connectors 210 which may be screws, bolts, or similar types of connectors. The fan assembly 204 may include an electrical connector 212 for making electrical connection with an external power source (not shown). The electrical connector may be in electrical communication with a circuit board 214, which may include one or more fuses, capacitors, or other circuit elements, that is secured to the mounting ring 202 The mounting ring 202 may include one or more mounting posts 216, one or more locking flanges 218, and one or more alignment posts 220. The mounting posts 216 may be tapered and have a circular cross section so as to form the general shape of a truncated cone.

Although four mounting posts 216, one locking flange 218, and one alignment post 220 are illustrated in FIGS. 6-8, alternate embodiments may have different numbers of these features. Alternate embodiments may also have mounting posts 216, one or more locking flanges 218, and one or more alignment posts 220 located in different positions than are illustrated in FIGS. 6-8. Further, the specific illustrated shapes of the mounting posts 216, the locking flanges 218, and the alignment posts 220 are not meant to be limiting. For example, alternate embodiments may have mounting posts 216 configured with a non-tapered and/or rectangular cross section. The locking flange 218 may in some embodiments be in the general shape of, for example, a "W" rather than a "V".

In some embodiments, the mounting ring 202, the plurality of mounting posts 216, the one or more locking flanges 218, and the one or more alignment posts 220 may be integrally formed from a single piece of material. This material may be, for example, injection molded plastic. In other embodiments, the plurality of tapered mounting posts 216, the locking flanges 218, and/or the alignment posts 220 may be formed separately from the mounting ring 202 and/or from one another and may comprise different materials from the mounting ring 202 or from one another. If formed separately from the mounting ring 202, the mounting posts 216, the locking flanges 218, and the alignment posts 220 may be secured to the mounting ring 202 by connectors, such as screws, or by an adhesive, such as epoxy.

Figure 9:
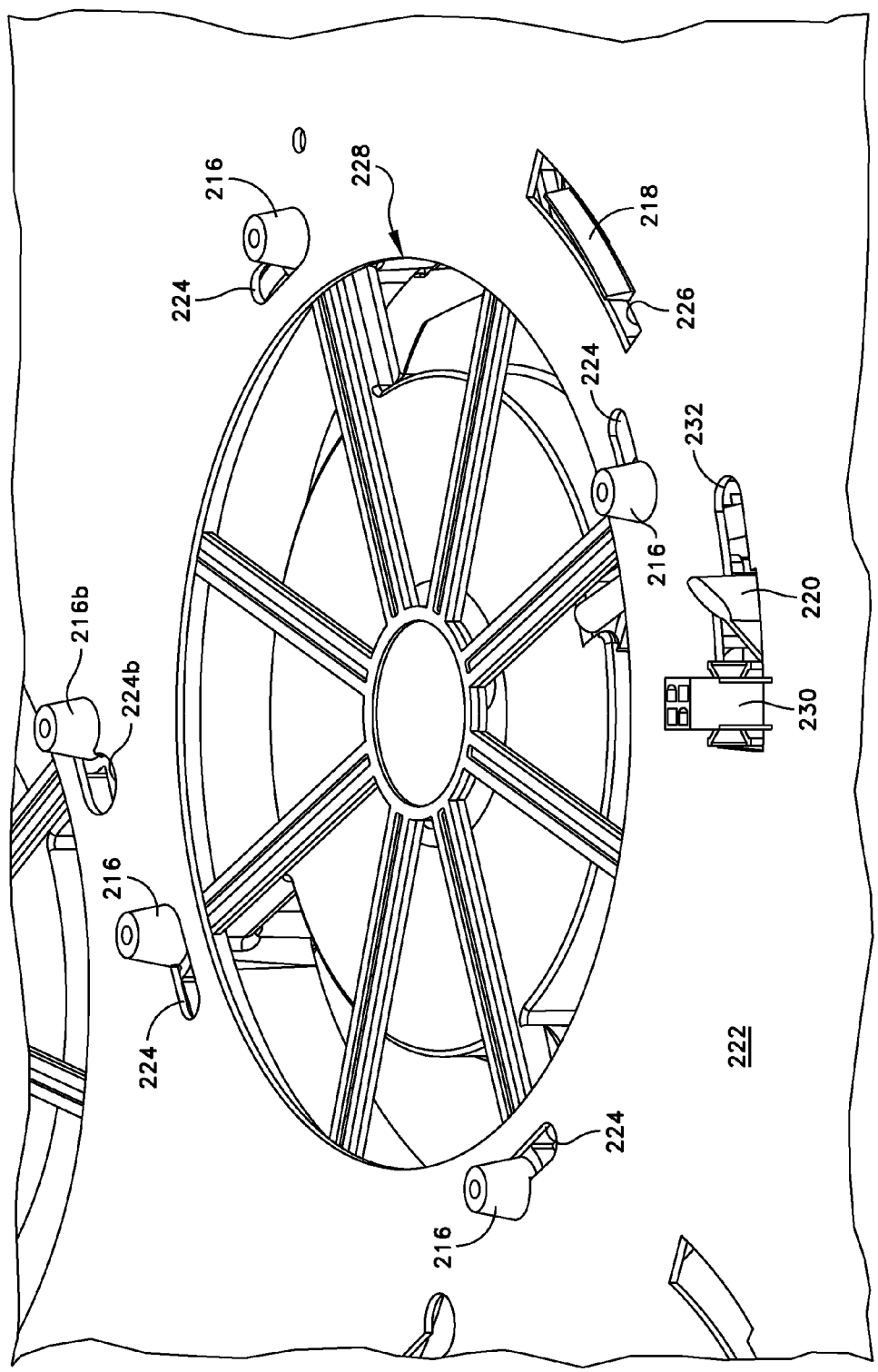
FIG. 9 is an enlarged top perspective view of the fan assembly in an unlocked position on a mounting plate.

FIG. 9 illustrates a mounting plate 222, which is suitably secured to, or otherwise part of a canopy structure, and the fan module of FIGS. 6-8, in which the mounting plate 222 is viewed from above. The fan module is in an unlocked position in the mounting plate 222. The mounting plate 222 may be formed integrally with, or mechanically coupled to, a roof or a wall of, for example, a cooling hood canopy or an overhead mounting assembly, used in a cooling enclosure for racks for electronic equipment. In FIG. 9, four tapered mounting posts 216 of a fan module 200 are shown protruding through mounting plate 222 through key slots 224. The key slots 224 include portions with a larger width, and portions with a smaller width. The portions of key slots 224 with the larger width have a width slightly larger than a maximum cross sectional diameter or width of the tapered mounting posts 216. This allows the tapered mounting posts 216 to be inserted through the key slots 224. The portions of key slots 224 with the smaller widths have widths slightly larger than a cross sectional diameter or width of a slot or undercut formed in the tapered mounting posts 216 and smaller than a maximum cross sectional diameter or width of the tapered mounting posts 216. The slots or undercuts in tapered mounting posts 216 may be located proximate to a portion of the tapered mounting posts 216 where the tapered mounting posts 216 join the body of the mounting ring 202. The slots or undercuts in tapered mounting posts 216 may define a ledge or engaging surface in the tapered mounting posts 216. The tapered mounting posts 216 are illustrated in FIG. 9 as protruding through the portions of key slots 224 with the larger widths. The tapered mounting posts 216 are in a position so that they are vertically removable from the key slots 224 and thus are in an unlocked position with respect to key slots 224. This position is to be contrasted with the position of tapered mounting post 216b in key slot 224b in FIG. 9 in which the tapered mounting post are positioned in the portion of key slot 224b in a locked position.

Still referring to FIG. 9, a portion of a locking flange 218 is illustrated as protruding upwardly through a locking flange slot 226 in the mounting plate 222. The portion of the locking flange 218 protruding upwardly through the locking flange slot 226 is tapered and forms a ledge at a portion of the locking flange adjacent the surface of the mounting plate 222. In alternate embodiments, no such taper or ledge is present in the locking flange 218. The locking flange slot 226 has a portion with a greater width and a portion with a smaller width. An inner edge of the locking flange slot 226 is equally, or at least approximately equally, spaced along its entire length from the center and/or edge of a fan air hole 228 in the mounting plate 222. An outer edge of the locking flange slot 226 is closer to the center and/or edge of the fan air hole 228 in the region of the locking flange slot 226 with the smaller width than in the region of the locking flange slot 226 with the greater width. In FIG. 9, locking flange 218 is in contact with an edge of the portion of the locking flange slot 226 having the smaller width. Insertion of the locking flange 218 through the portion of the locking flange slot 226 with the smaller width forces the locking flange 218 inward toward the center of the fan assembly. This places the locking flange 218 in tension relative to a state in which it is not in contact with an edge of the locking flange slot 226. In the position illustrated in FIG. 9, the locking flange 218 exerts a force against the outer edge of the locking flange mounting slot 226.

In alternate embodiments, the inner edge of locking flange slot 226 may vary in distance along its length from the edge of the fan air hole 228, and the outer edge of locking flange slot 226 may have a constant or nearly constant spacing from the edge of the fan air hole 228. In these embodiments, locking flange 226 would be pulled outward away from the center of the fan assembly when introduced through the portion of the locking flange slot 226 with the smaller width and exert a force against the inner edge of the locking flange slot 226.

Also illustrated in FIG. 9 is an electrical mating connector 230 mounted in a sliding relationship in the electrical connector slot 232. In use an electrical cable (not shown) having one or more conductive wires would be electrically connected to contacts in the electrical mating connector 230. When the fan module mounting ring 202 is mounted into the mounting plate 222, the alignment post 220 is introduced through the electrical connector slot 232 and forces the electrical mating connector 230 toward an edge of the electrical connector slot 232. In this position, electrical mating connector 230 is aligned with the electrical connector 212 of the fan assembly 204 (located below the mounting plate 222 and thus not visible in FIG. 9). The electrical mating connector 230 may thus engage and form an electrical connection with the electrical connector 212 of the fan assembly 204 as the fan assembly 204 is pushed upward against the lower surface of the mounting plate 222. The electrical connector slot 232 may have a region with a greater width in which the electrical mating connector 230 may be slidably mounted. The electrical connector slot 232 may have a region with a smaller width in which the connector mate alignment post 220 may be positioned upon locking of the fan module in place in the mounting plate 222 as is illustrated in FIG. 10.

Figure 10:
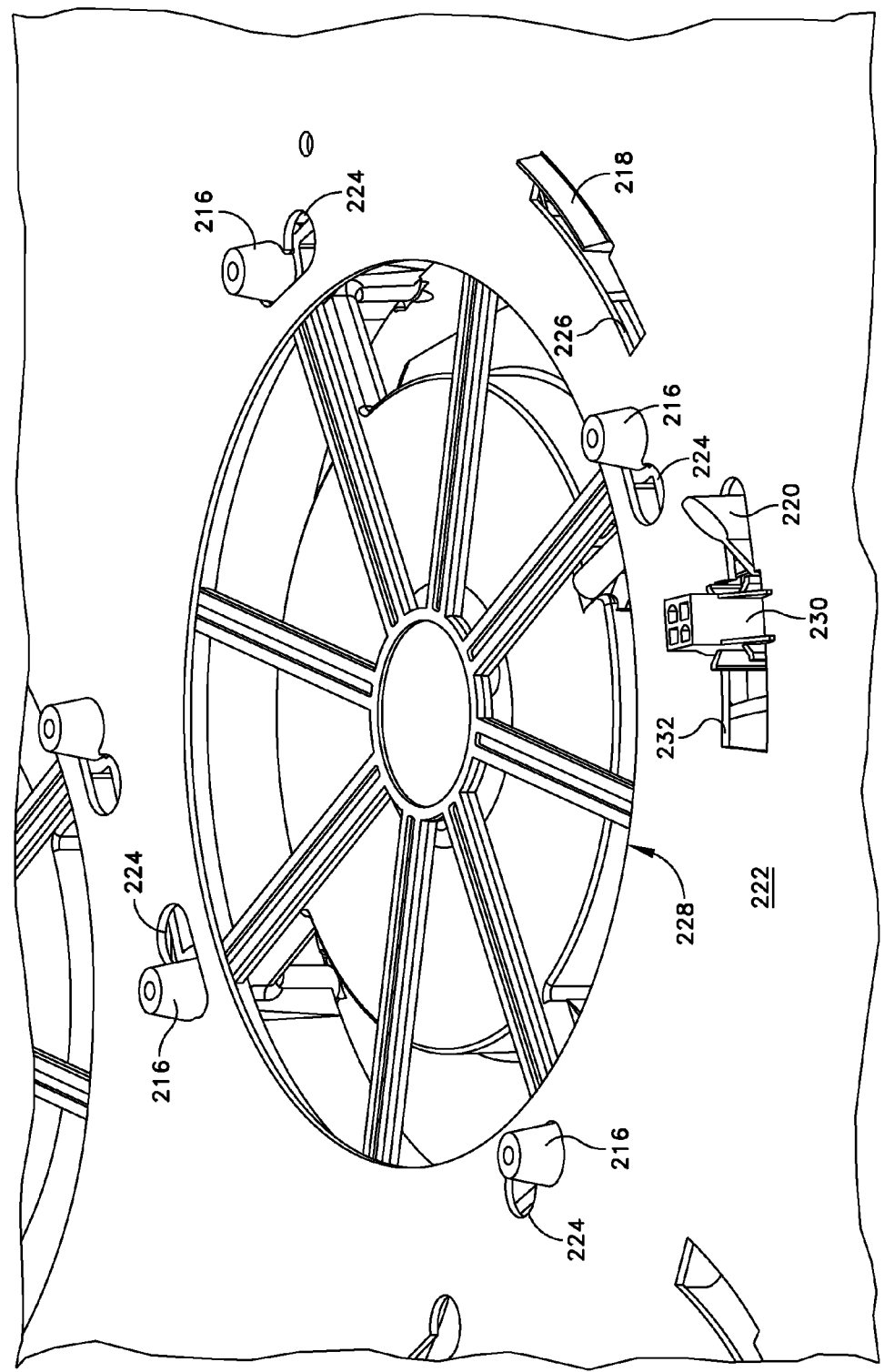
FIG. 10 is an enlarged top perspective view of the fan assembly in a locked, mounted position on the mounting plate.

FIG. 10 illustrates the fan module of FIGS. 6-8 in a locked position in a mounting plate 222 viewed from above the mounting plate 222. This position may be achieved by inserting the mounting posts 216 through the key slots 224, the locking flange 218 through the locking flange slot 226, and the connector mate alignment post 220 through electrical connector slot 232 in the manner illustrated in FIG. 9 and then rotating the fan assembly counter-clockwise as viewed from above. In the position illustrated in FIG. 10, the mounting posts 216 protrude through the portions of key slots 224 with the smaller widths. In this position, the ledges formed by the slots or undercuts in the mounting posts 216 prevent the mounting posts 216 from being removed from the key slots 224 by vertical displacement. In the locked position of FIG. 10, locking flange 218 is positioned in the portion of locking flange slot 226 with the greater width. The locking flange 218 is thus allowed to move outward from the center of the fan assembly relative to its position in FIG. 9. In this position the locking flange 218 is trapped in the portion of locking flange slot 226 with the greater width by an abrupt change in width between the portion of locking flange slot 226 with the greater width and the portion of locking flange slot 226 with the smaller width. This prevents the fan assembly from being rotated relative to mounting plate 222 unless the portion of locking flange 218 extending through locking flange slot 226 is moved inward so as to clear the abrupt change in width between the portion of locking flange slot 226 with the greater width and the portion of locking flange slot 226 with the smaller width. Also, as illustrated in FIG. 10, the alignment post 220 has been moved into the portion of electrical connector slot 232 having the smaller width.

Figure 11:
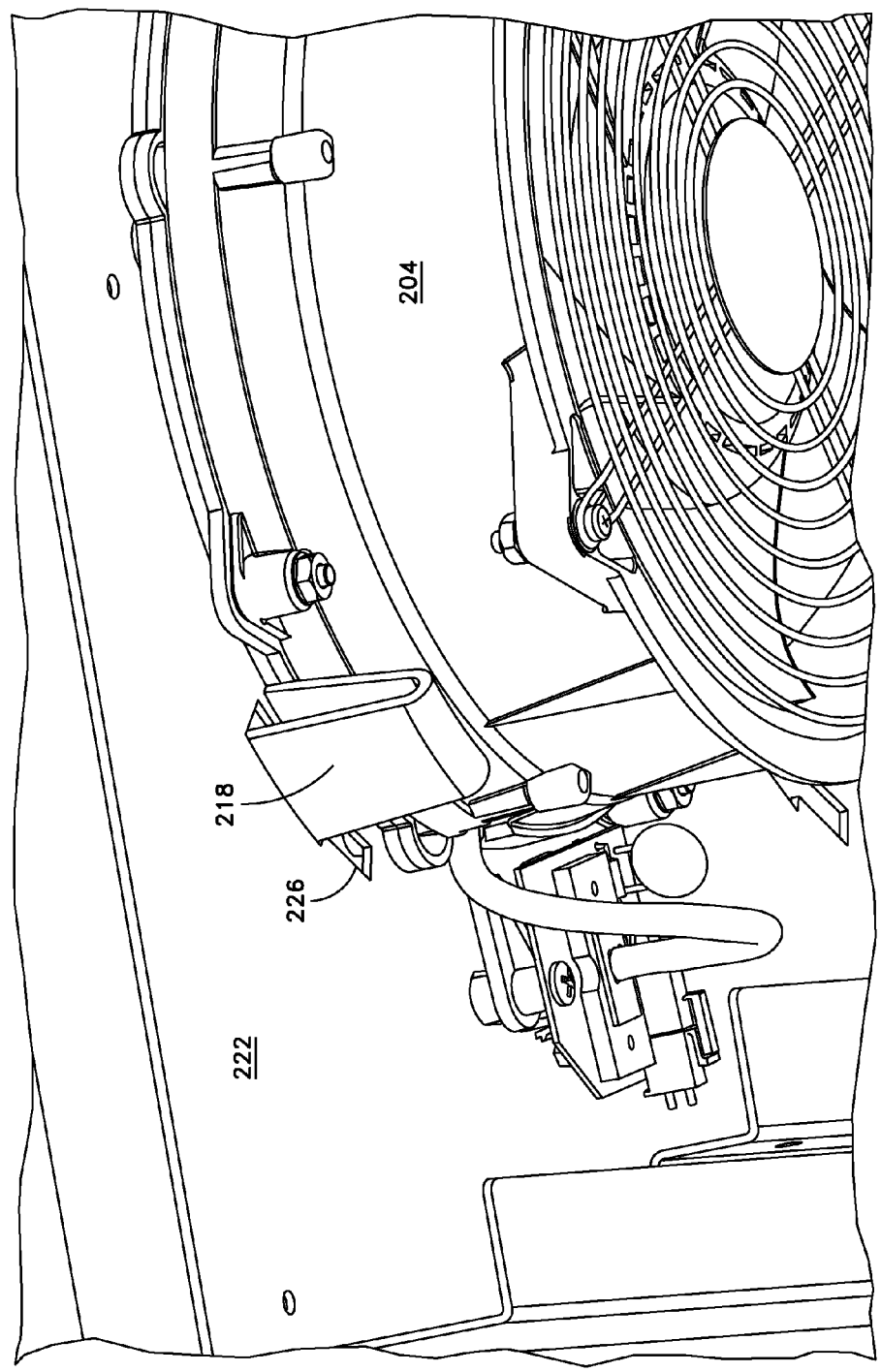
FIG. 11 is an enlarged bottom perspective view of the fan assembly in a locked, mounted position on the mounting plate.
Figure 12:
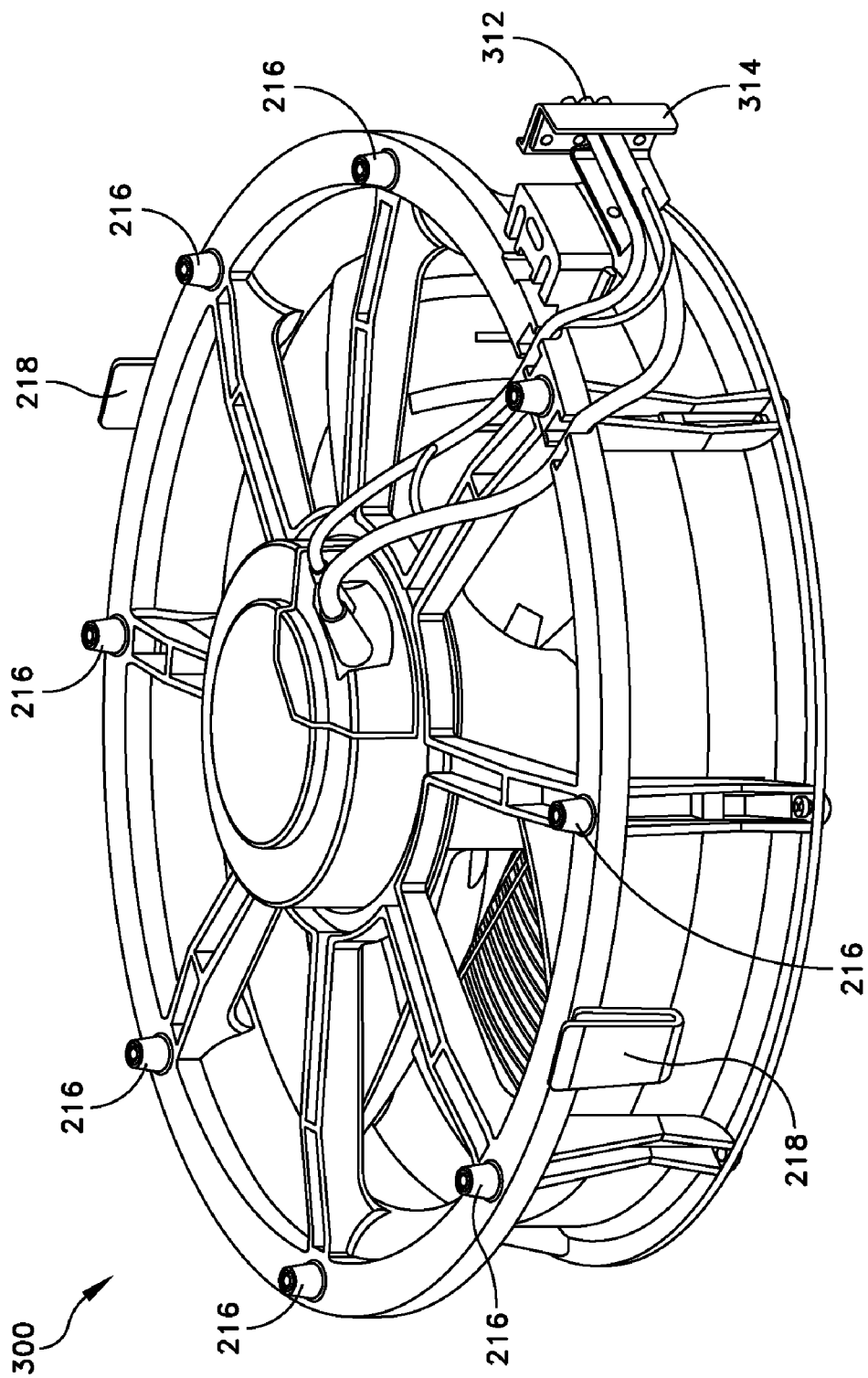
FIG. 12 is a perspective view of assembled fan assembly according to another embodiment.
Figure 13:
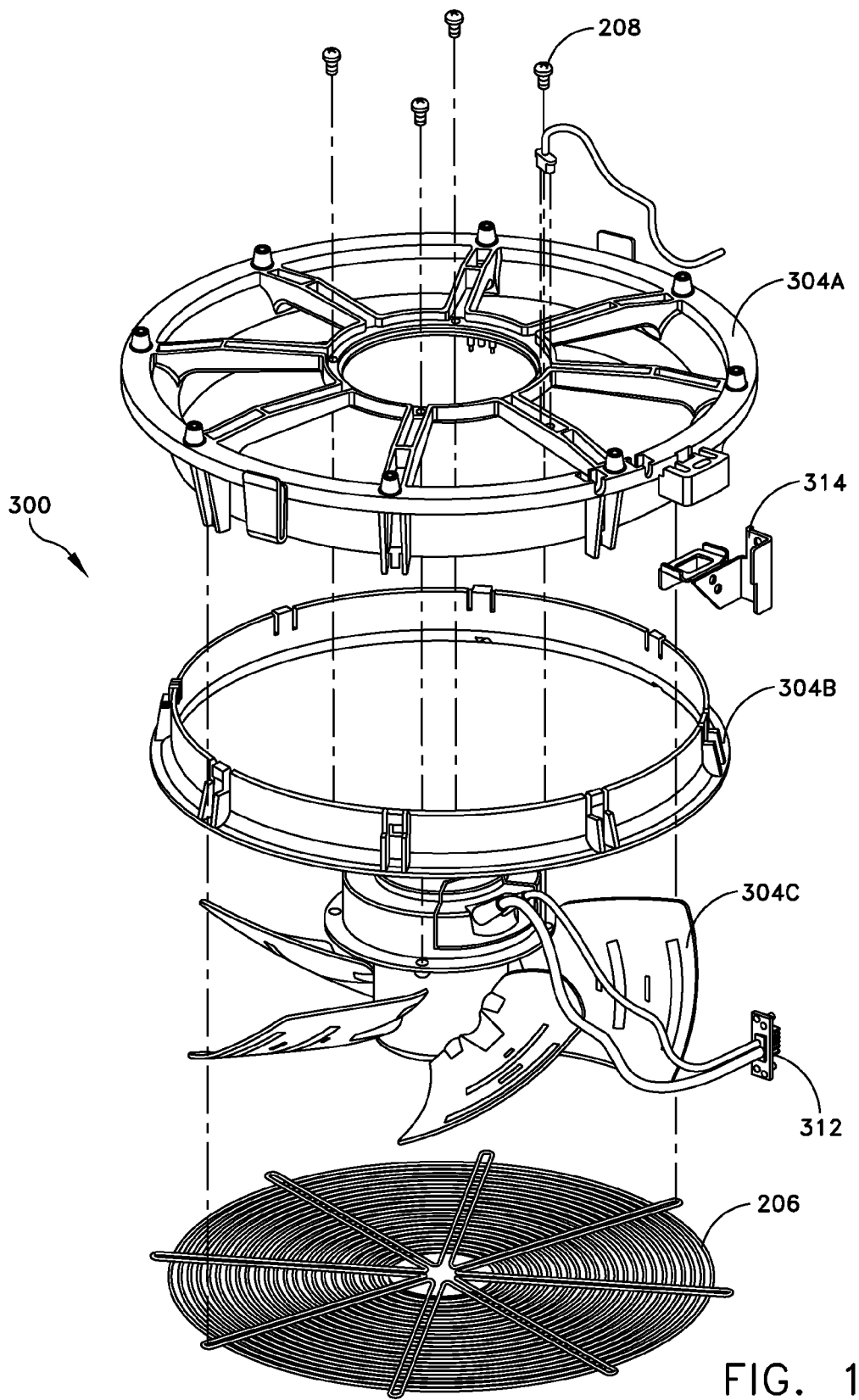
FIG. 13 is an exploded perspective view of the fan assembly shown in FIG. 12.
Figure 14:
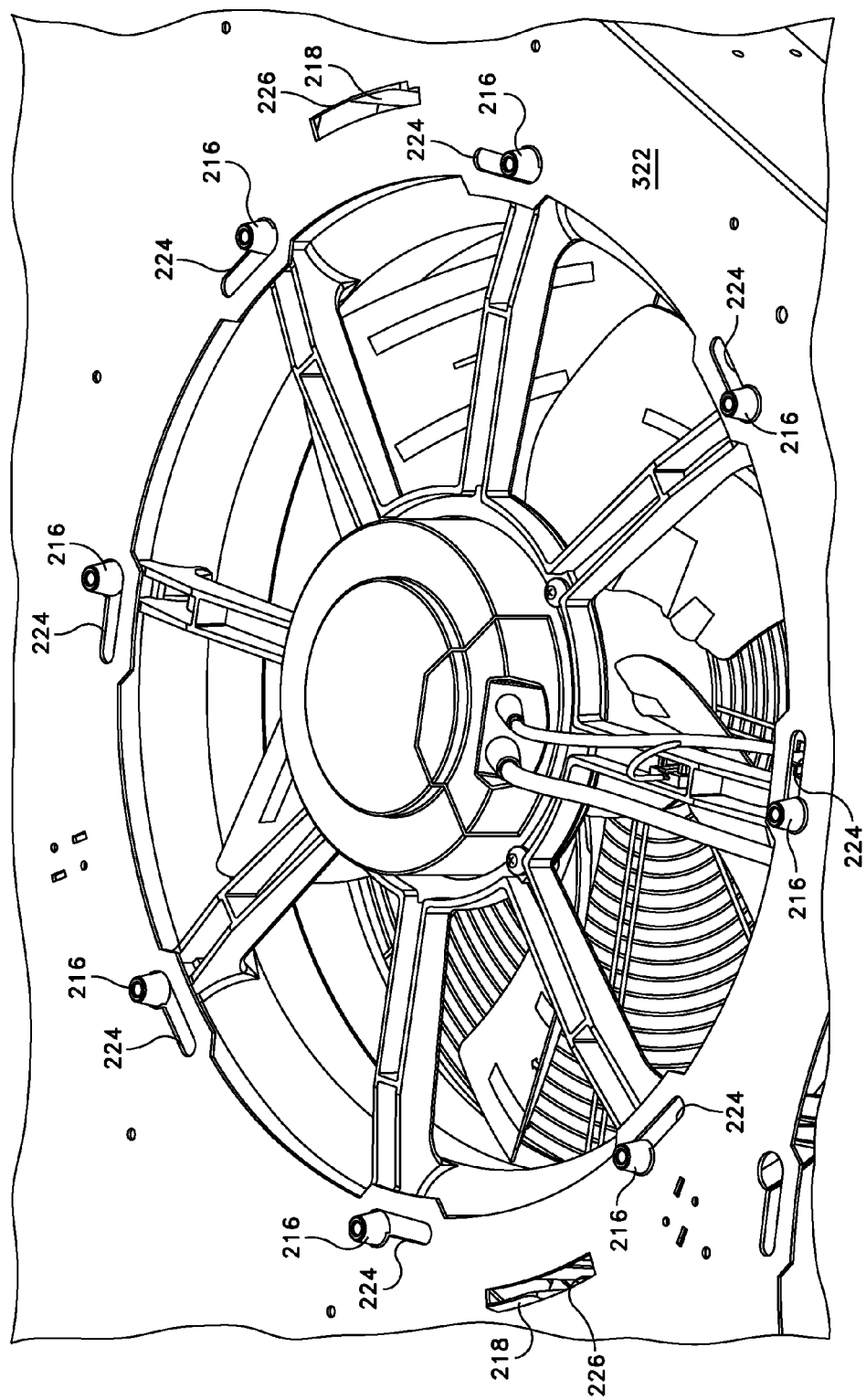
FIG. 14 is an enlarged top perspective view of the fan assembly of FIG. 12 in an unlocked position on a mounting plate.
Figure 15:
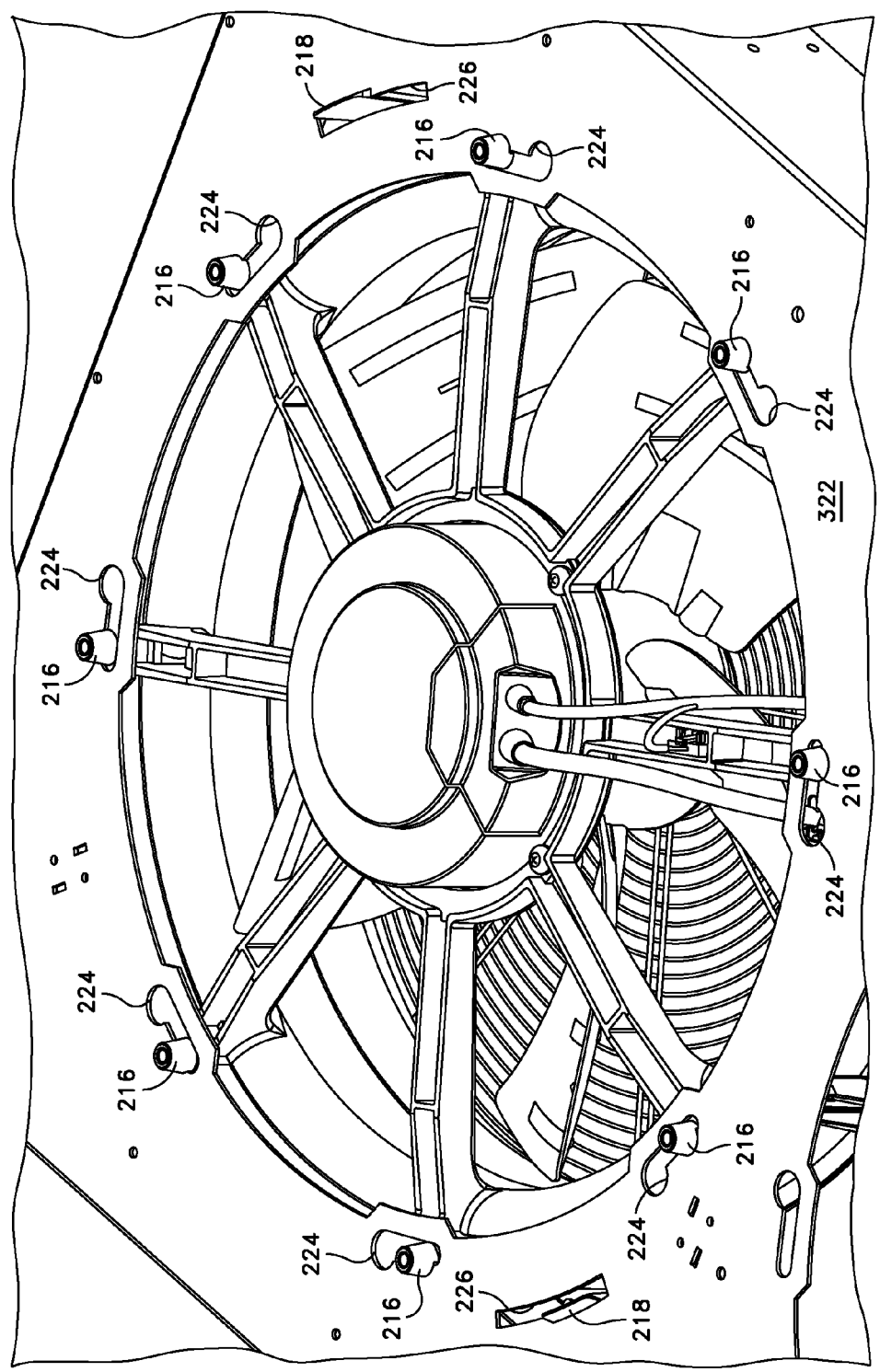
FIG. 15 is an enlarged top perspective view of the fan assembly of FIG. 12 in a locked, mounted position on the mounting plate.
Figure 16:
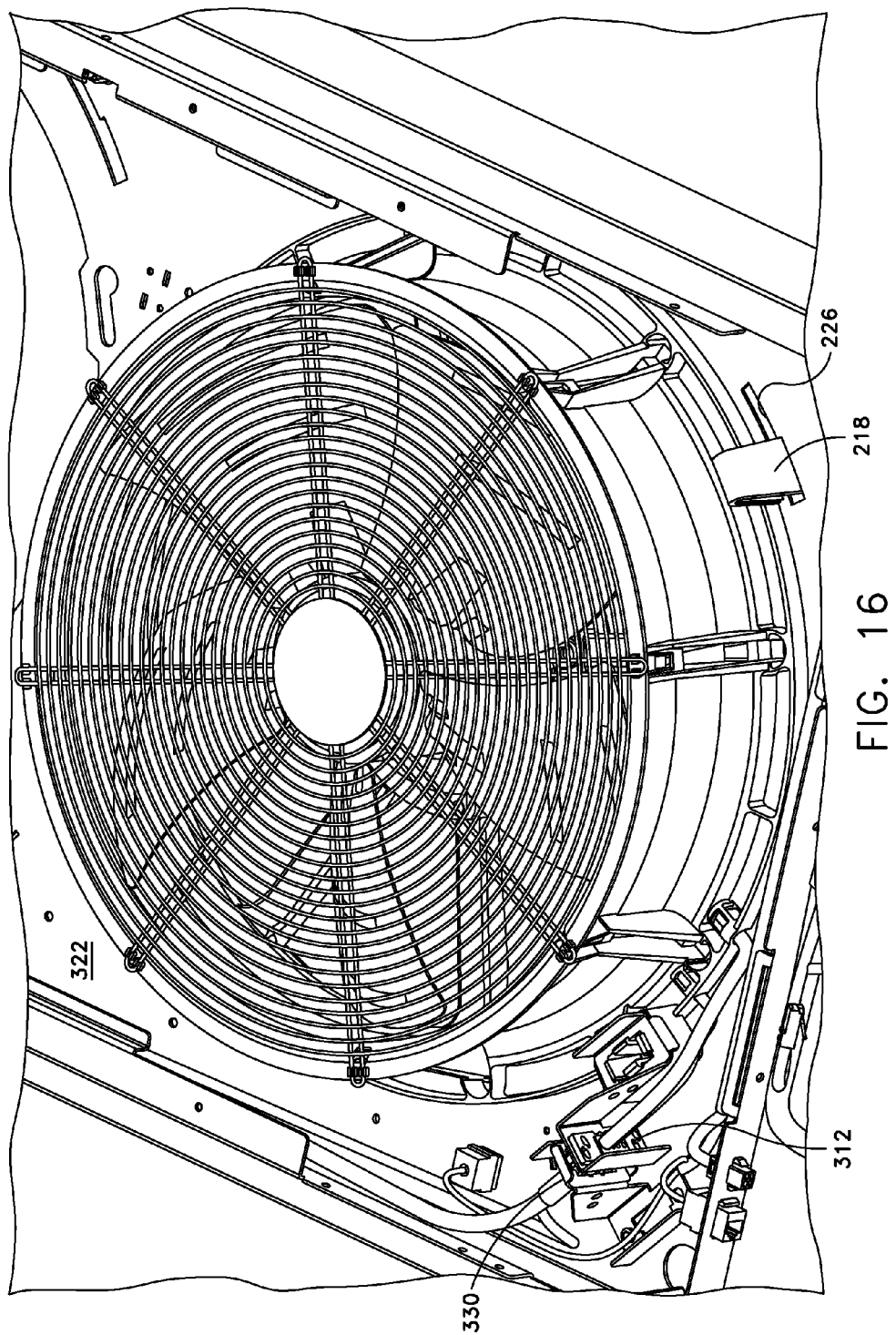
FIG. 16 is an enlarged bottom perspective view of the fan assembly of FIG. 12 in a locked, mounted position on the mounting plate.

FIG. 11 illustrates the fan assembly coupled to the mounting plate 222 in the locked position as shown in FIG. 10 from a fan side or underside of the mounting plate 222. In this position the locking flange 218 is illustrated as trapped in the portion of locking flange slot 226 with the greater width. To remove the fan assembly from the mounting plate 222 an operator would squeeze the sides of the locking flange 218 toward one another to free the locking flange 218 and allow the fan assembly to be rotated with respect to the mounting plate 222.

In alternate embodiments, locking of the fan assembly to the mounting plate 222 may be accomplished by a clockwise rotation or a linear displacement rather than by a counter-clockwise rotation relative to the mounting plate 222. In these alternate embodiments, the key slots 224, the locking flange slot(s) 226, and the electrical connector slot(s) 232 would be appropriately rearranged relative to the positions and orientations illustrated in FIGS. 9-11. In some alternate embodiments, bayonet mounts may be provided on the fan assembly and/or mounting plate for locking of the fan assembly to the mounting plate.

The shapes of the key slots 224, the locking flange slot(s) 226, and the electrical connector slot(s) 232 illustrated are not intended to be limiting. For example, the key slots 224, and/or the locking flange slot(s) 226 and/or the electrical connector slot(s) 232 may vary in width either more significantly or less significantly or more smoothly or less smoothly along their lengths than as illustrated. These slots may also be of different sizes or positioned differently than as is illustrated. Further, mounting plate 222 need not be in the form of a flat plate as is illustrated. Mounting plate 222 may be formed, for example, from a plurality of different portions and/or may include portions that are not co-planar with one another. Mounting plate 222 may be formed integral to a wall or a canopy of a cooling unit or may be formed as a separate unit and may include brackets, flanges, mounting holes, or other mechanisms to facilitate attachment of the mounting plate to a surface.

Fan assemblies, such as the assembly illustrated in FIGS. 6-8, 12, and 13 may be mounted to a canopy or a wall of a cooling system in accordance with embodiments of methods of the present disclosure. These methods may be performed without the use of tools, such as screwdrivers, wrenches, or the like.

Another embodiment of a fan module 300 according to the present disclosure is illustrated in FIGS. 12-16. Fan module 300 is similar to fan module 200, but includes eight, rather than six mounting posts 216, although in other embodiments a fewer or greater number of mounting posts may be utilized. Fan module 300 includes two locking flanges 218. Unlike fan module 200, fan module 300 is configured to make an electrical connection using an electrical connector 312 that is oriented parallel, instead of perpendicular, to a mounting plate 322 to which the fan module 300 may be attached. A circuit board 314 including similar electrical components as circuit board 212 described above may be provided in electrical communication with the electrical connector 312. A second electrical connector 330 is positioned on a mounting plate 322 such that an electrical connection is formed between the electrical connector 312 on the fan module and the electrical connector 330 when the fan module is positioned into a locked position in the mounting plate 322. As such, fan module 330 does not require an alignment post 220, and mounting plate 332 does not require a slot 232 in which to slidably mount an electrical connector 230.

Further, in fan module 300, the fan housing is made up of two pieces 304A and 304B which in some embodiments may be formed from injection molded plastic. Fan housing pieces 304A and 304B may snap together to form a fan housing and enclose a fan assembly 304C including a fan motor and fan. In some embodiments fan hosing pieces 304A and 304B may be joined with screws, bolts or other connectors, or may be joined by welding or by an adhesive. In the embodiment of fan module 300 illustrated, the mounting posts 216 and locking flanges 218 are formed in a mounting ring that is integral to the housing itself. The fan screen 206 may be snapped into position in catches formed in the fan housing.

Fan module 300 may be attached to the mounting plate 322 in similar manners as described above with regard to fan module 200 and mounting plate 222.

A method of mounting a fan assembly to a canopy of a cooling system may include securing a mounting plate 222, 322 to the canopy. The mounting plate may be similar to the mounting plates illustrated in FIGS. 9-11 and 14-16 and may include at least one key slot 224 formed therein. The mounting plate may also include at least one locking flange slot 226, and/or at least one electrical connector slot 232 formed therein. Alternatively, the key slot 224, the locking flange slots 226, and the electrical connector slot 232 may be formed directly in the canopy or wall of the cooling system. The method may further include providing a fan assembly including a fan unit having a fan, a motor for driving the fan, and a mounting ring 202 or fan housing having at least one mounting post 216. The fan assembly may be secured to the mounting plate 222, 322, canopy, or wall of the cooling system by inserting the mounting posts 216 into the key slots 224 and displacing the mounting posts 216 through the key slots 224. Displacing the mounting posts 216 through the key slots 224 may include displacing the mounting posts 216 within the key slots 224 by rotating the mounting ring 202 or fan housing and/or may include linearly or rotationally displacing the mounting posts 216 within the key slots 224. The mounting posts 216 may include an undercut or a slot that may engage the mounting plate 222, 322, canopy, or wall of the cooling system and secure the fan assembly thereto upon rotation or displacement of the mounting posts 216 within the key slots 224.

The method may include inserting a flexible locking flange 218 into a recess or slot in the mounting plate 222, 322, canopy, or wall of the cooling system. Rotation or linear displacement of the mounting ring or fan assembly may cause the locking flange to move into a locking position in the recess or slot and engage the mounting plate 222, 322, canopy, or wall of the cooling system to lock the fan assembly in place.

The method may further include inserting at least one connector mate alignment post 220 into at least one recess or electrical connector slots 232 in the mounting plate 222, canopy, or wall of the cooling system. The connector mate alignment post 220 may make contact with an electrical mating connector 230 and move it into a position where it is aligned with an electrical connector 212 of the fan assembly. Alternatively an electrical connector 312 coupled to the fan assembly may make electrical contact with an electrical connector 330 coupled to the mounting plate 322 without requiring displacement of the electrical connector 330. Upon mounting of the fan assembly to the mounting plate 222, 322, canopy, or wall of the cooling system, the electrical mating connector 230, 330 may engage and form an electrical connection with the electrical connector 212, 312 of the fan assembly.

A fan module as described with reference to FIGS. 6-8 and 12-13 may be provided as a kit. The kit may include a fan unit 204 having a fan and a motor for driving the fan. The fan unit may further include an electrical connector 212. The kit may include a fan screen 206. The kit may also include a mounting assembly configured for attachment to the fan unit. The mounting assembly may include a mounting ring 202 having at least one mounting post 216. The mounting ring may also include at least one flexible locking flange 218 and/or at least one alignment post 220. The kit may further include a mounting plate 222. The mounting post may be configured to pass through the key slot in the mounting plate 222. The flexible locking flange 218 may be configured to pass through a locking recess or slot in the mounting plate and engage the mounting plate. The mounting plate 222 may include an electrical mating connector 230. The alignment post 220 may be configured to align the electrical mating connector 230 with the electrical connector 212 when the fan unit is mounted upon the mounting plate. In alternate embodiments, features such as the mounting post 216, the flexible locking flange 218, and the alignment post 220 may be located on the mounting plate rather than on the mounting ring. These features may also be provided as separate units to be connected to the mounting ring 202 or mounting plate 222 by connectors such as screws or an adhesive such as epoxy or rubber cement. The kit may further include connectors, such as screws or bolts for connecting the various parts of the kit. Instructions for assembling the kit may be provided in print or in computer readable form, such as on a CD or a flash drive.

In an alternate embodiment, the kit may include a fan housing formed from two pieces 304A and 304B that may be snapped together or otherwise joined to enclose a fan assembly 304C including a fan motor and a fan. In further embodiments the fan housing may be formed from more than two pieces. Mounting posts 216 and locking flanges 218 may be formed on a mounting ring which is integral to the fan housing. Connectors 208 may be provided for securing the fan assembly 304C within the fan housing. An alternate mounting plate 322 may also be provided with the kit.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An air containment cooling system for containing air between two rows of equipment racks, the air containment cooling system comprising:
    a canopy assembly configured to enclose a hot aisle defined by two rows of equipment racks;
    a cooling system embedded within the canopy assembly, the cooling system being configured to cool air disposed within the hot aisle, the cooling system including a heat exchanger, a mounting plate being one of coupled to and formed integral with the canopy assembly and having a fan air hole defined therein, and a fan assembly configured to move air to the heat exchanger through the fan air hole, the fan assembly being releasably mounted on the mounting plate, the fan assembly including:
        a fan unit having a fan and a motor;
        a mounting ring configured to mount the fan unit thereon and to position a surface of the fan unit proximate the fan air hole, the mounting ring being rotatably secured to the mounting plate and having a first interconnect comprising a flexible locking flange configured to be secured to a second interconnect comprising a recess formed in the mounting plate to secure the mounting ring to the mounting plate about the fan air hole; and
        an alignment post coupled to the mounting ring and configured to pass through a slot formed in the mounting plate and to slide a floating mating connector coupled to the slot in the mounting plate into alignment with an electrical connector on the mounting ring.

2. The system of claim 1, wherein the first interconnect comprises a mounting post and the second interconnect comprises a slot formed in the mounting plate.

3. The system of claim 1, wherein the fan assembly further includes a wiring assembly, and an alignment post configured to align the mounting ring in a predetermined position with respect to the mounting plate.

4. A method of mounting a fan assembly to a canopy of a cooling system comprising:
providing a mounting plate being one of secured to and formed integral with the canopy, the mounting plate including a first interconnect comprising a recess formed in the mounting plate and a fan air hole formed therein;
providing a fan assembly including:
a fan unit having a fan and a motor;
a mounting ring configured to mount the fan unit thereon and to position a surface of the fan unit proximate the fan air hole, providing for the fan to direct air through the fan air hole, the mounting ring having a second interconnect comprising a flexible locking flange; and
an alignment post coupled to the mounting ring and configured to pass through a slot formed in the mounting plate and to slide a floating mating connector coupled to the slot in the mounting plate into alignment with an electrical connector on the mounting ring;
securing the fan assembly to the mounting plate by rotatably securing the first interconnect to the second interconnect such that the mounting ring is secured about the fan air hole; and
electrically connecting an electrical connector on the fan module to a power supply.

5. The method of claim 4, wherein the first interconnect comprises a slot and the second interconnect comprises a mounting post.

6. The method of claim 5, wherein securing the first interconnect to the second interconnect comprises inserting the mounting post into the slot and displacing the mounting post within the slot.

7. The method of claim 5, wherein the mounting post is configured with an undercut.

8. The method of claim 5, further comprising removing the fan assembly from the mounting plate, wherein removing the fan assembly includes:
moving a first side of the flexible locking flange toward a second side of the flexible locking flange such that the flexible locking flange may be removed from the recess in the mounting plate;
displacing the mounting post within the slot; and
removing the mounting post from within the slot.

9. The method of claim 8, comprising removing the fan assembly from the mounting plate without tools and by accessing only a single side of the mounting plate.

10. The method of claim 6, wherein displacing the mounting post within the slot comprises rotationally displacing the mounting ring.

11. The method of claim 6, wherein displacing the mounting post within the slot comprises linearly displacing the mounting post.

12. An air containment cooling system for containing air between two rows of equipment racks, the air containment cooling system comprising:
means for enclosing a hot aisle defined by two rows of equipment racks;
a cooling system embedded within the means for enclosing the hot aisle, the cooling system being configured to cool air disposed within the hot aisle, the cooling system including:
a heat exchanger;
a first mounting means including a fan air hole and a recess defined therein, the first mounting means being one of coupled to and formed integral with the means for enclosing the hot aisle; and
means for moving air to the heat exchanger through the first mounting means;
the means for moving air to the heat exchanger being releasably mounted on the first mounting means, the means for moving air to the heat exchanger including a second mounting means, the second mounting means including:
a first interconnect configured to be secured to a second interconnect provided in the first mounting means to secure the second mounting means to the first mounting means;
a locking means configured to engage the recess in the first mounting means; and
an alignment post coupled to the second mounting means and configured to pass through a slot formed in the first mounting means and to slide a floating mating connector coupled to the slot in the first mounting means into alignment with an electrical connector on the second mounting means.

13. The system of claim 12, wherein the first mounting means further includes a means for aligning an electrical connector.

14. The system of claim 1, wherein the fan assembly further comprises a generally annular housing supporting the fan and the motor therewithin, and wherein the mounting ring is directly coupled to a mounting surface of the housing.

15. The system of claim 12, wherein the means for moving air to the heat exchanger comprises a generally annular housing supporting a fan and a motor therewithin, and wherein the mounting ring is directly coupled to a mounting surface of the housing.

16. The system of claim 12, wherein the fan assembly further comprises a generally annular housing supporting the fan and the motor therewithin, and wherein the second mounting means is directly coupled to a mounting surface of the housing.

* * * * *